United States Patent [19]
Borchert

[11] Patent Number: 6,107,711
[45] Date of Patent: Aug. 22, 2000

[54] BRUSHLESS EXCITER FOR A ROTATING ELECTROMAGNETIC MACHINE

[75] Inventor: David T. Borchert, Kasota, Minn.

[73] Assignee: Emerson Electric Co., St. Louis, Mo.

[21] Appl. No.: 09/137,573

[22] Filed: Aug. 21, 1998

[51] Int. Cl.[7] .................................................. H02K 11/00
[52] U.S. Cl. ...................... 310/68 D; 310/68 R; 165/80.3
[58] Field of Search ................................ 310/68 D, 68 R, 310/67 R, 71, 72; 257/726, 727, 722, 718; 165/80.3

[56] References Cited

U.S. PATENT DOCUMENTS

| | | | |
|---|---|---|---|
| 3,354,330 | 11/1967 | Storsand | 310/68 D |
| 3,684,944 | 8/1972 | Evgrafov et al. | 363/126 |
| 3,721,843 | 3/1973 | Spisak et al. | 310/68 D |
| 3,763,402 | 10/1973 | Shore et al. | 257/722 |
| 3,766,977 | 10/1973 | Pravda et al. | 165/47 |
| 3,866,196 | 2/1975 | Mann et al. | 340/639 |
| 3,872,335 | 3/1975 | Petersen et al. | 310/68 D |
| 3,902,774 | 9/1975 | Gronholm | 310/68 D |
| 3,955,122 | 5/1976 | Maynard et al. | 361/710 |
| 4,052,631 | 10/1977 | Kuter | 310/68 D |
| 4,646,131 | 2/1987 | Amagasa et al. | 257/785 |
| 4,723,106 | 2/1988 | Gibbs et al. | 322/26 |

FOREIGN PATENT DOCUMENTS

3620251 A1   10/1986   Germany.

*Primary Examiner*—Nestor Ramirez
*Assistant Examiner*—Joseph Waks
*Attorney, Agent, or Firm*—Howrey Simon Arnold & White, LLP

[57] ABSTRACT

A rectifier assembly for use in a rotating electromagnetic machine includes an outer heat sink and an inner heat sink. The outer heat sink is configured to be connected with a diode wheel rim such that an air space is defined therebetween for cooling during rotation of the diode wheel rim. At least one rectifier element is disposed between and electrically connected with the outer heat sink and the inner heat sink. A block is disposed adjacent to the outer heat sink generally opposite the at least one rectifier element. A clamping bolt extending through the inner heat sink and the outer heat sink is threadingly engaged with the block. An electrically insulating tube is disposed around the clamping bolt. An elastomeric spacer is positioned around the clamping bolt on an end of the tube. The spacer is configured to accommodate axial stack-up tolerances of the rectifier assembly in an axial direction of the clamping bolt.

28 Claims, 2 Drawing Sheets

BRUSHLESS EXCITER FOR A ROTATING ELECTROMAGNETIC MACHINE

TECHNICAL FIELD

The present invention relates to rotating electromagnetic machines, such as generators and motors, and, more particularly, to rotating electromagnetic machines including a brushless exciter.

BACKGROUND ART

Large generators are driven by a prime mover to produce a supply of electric energy. A generator rotor is energized by an exciter providing to it a supply of direct current (DC) power effective to produce a magnetic field rotating with the rotor. An annular stator surrounding the rotor contains a plurality of windings in which electricity is induced by the rotating magnetic field.

Providing the supply of DC power to the rotor involves transferring the DC power from a stationary element to the rotating element. One method of transferring the DC power includes slip rings rotating with the rotor and stationary brushes contacting the slip rings.

Slip-ring techniques are subject to reliability problems. An improved technique for transferring power from the stationary to the rotating element is conventionally known as a brushless exciter in which a DC field is applied to a stationary exciter winding. One or more windings rotating with the rotor pass through the magnetic field produced by the stationary exciter winding thereby producing alternating current (AC) power. The exciter AC power is rectified in a rectifier located on the rotor to produce the required DC excitation.

The amount of DC exciter power required by the rotor varies with the generator load. That is, as the generator load increases, the magnitude of the rotor magnetic field must be increased to maintain the desired output. This is conventionally accomplished by varying the amount of DC power fed to the stationary exciter winding. The DC power may be controlled by a control signal or in response to a measurement of the generator output voltage, optionally combined with a measurement of the generator output current.

An exciter field control responds to a drop in the generator output voltage with an increase in DC voltage fed to the stationary exciter winding. In some installations, the magnitudes and phase relationships of the output voltage and current are employed to compensate the exciter field voltage for the reactive component of the generator output.

For reference to the details of a conventional brushless exciter as described above, reference is hereby made to U.S. Pat. No. 4,723,106 (Gibbs, et al.). Conventional brushless exciters as described above typically include a rotating rectifier bridge with a plurality of rectifier assemblies, with each rectifier assembly having a number of parts which must be assembled together on the inside of a diode wheel rim. The various parts are usually held in place on the inside of the diode wheel rim by hand or with a wedge. A clamping bolt extending through the diode wheel rim from the outside of the diode wheel rim passes through an outer heat sink and an inner heat sink to a clamping bar located adjacent the inner heat sink. A problem with assembling a rectifier assembly in this manner is that the various parts of the rectifier assembly must be manually assembled within the diode wheel rim. Space is limited within the diode wheel rim, making assembly sometimes difficult. Moreover, visual inspection of the rectifier assembly within the diode wheel rim is difficult after assembly inside the diode wheel rim. Thus, it is nearly impossible to ensure that the rectifier diodes have been properly seated between the inner heat sink and the outer heat sink, which is necessary to ensure both good electrical as well as thermal conductivity.

The present invention is directed to overcoming one or more of the problems as set forth above.

SUMMARY OF THE INVENTION

The present invention provides a rectifier assembly which may be relatively easily aligned and assembled to a block, and thereafter mounted as a unit to a diode wheel rim. The rectifier assembly is configured to define a convection cooling space with the diode wheel rim and to accommodate axial stack-up tolerances. In one aspect of the invention, a rectifier assembly for use in a rotating electromagnetic machine includes an outer heat sink and an inner heat sink. The outer heat sink is configured to be connected with a diode wheel rim such that an air space is defined therebetween for cooling during rotation of the diode wheel rim. At least one rectifier element is disposed between and electrically connected with the outer heat sink and the inner heat sink. A block is disposed adjacent to the outer heat sink generally opposite the at least one rectifier element. A clamping bolt extending through the inner heat sink and the outer heat sink is threadingly engaged with the block. An electrically insulating tube is disposed around the clamping bolt. An elastomeric spacer is positioned around the clamping bolt on an end of the tube. The spacer is configured to accommodate axial stack-up tolerances of the rectifier assembly in an axial direction of the clamping bolt.

An advantage of the present invention is that the heat sinks are better cooled through the creation of a convection cooling air space between the outer heat sink and diode wheel rim.

Another advantage is that axial stack-up tolerances are accommodated through the use of an elastomeric spacer.

Yet another advantage is that the various parts of the rectifier assembly may be relatively easily aligned and assembled together, and thereafter installed as a unit in a diode wheel rim.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein:

FIG. 1A is a block diagram schematically illustrating the rotor, diode wheel rim and rectifier assembly in accordance with embodiments of the present invention;

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE INVENTION

Figure 1:
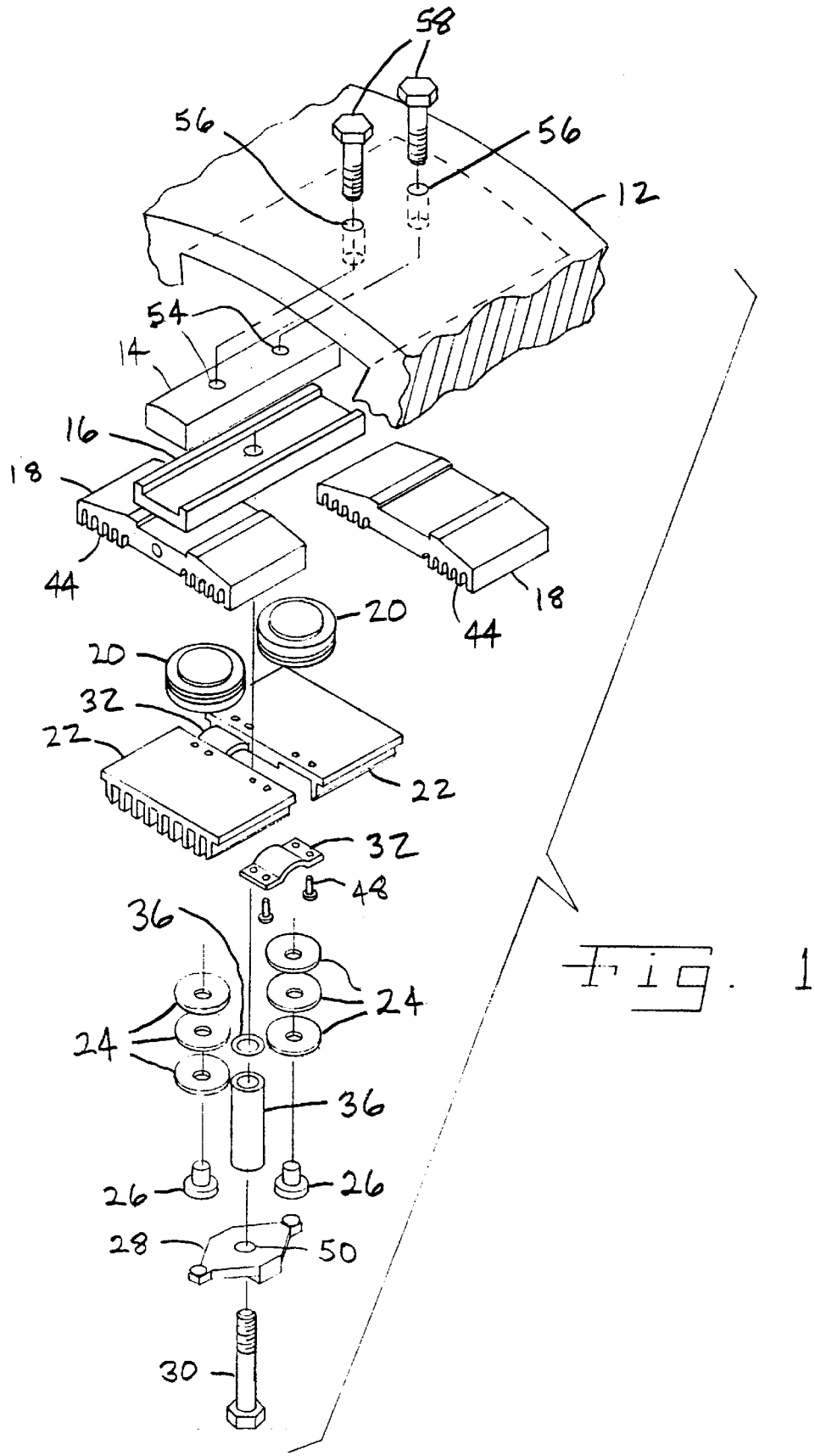
FIG. 1 is an exploded, perspective view of an embodiment of a rectifier assembly of the present invention, shown with respect to a portion of a diode wheel rim.

Referring now to the drawings, there is shown an embodiment of a rectifier assembly 10 of the present invention for use in a rotating rectifier bridge of a rotating electromagnetic machine, such as a generator or a motor. Rectifier assembly 10 is connected to and carried by a diode wheel rim 12, which in turn is mounted to and carried by a rotor 9 in the electromagnetic machine. Rectifier assembly 10, in known manner, is used to convert AC power into DC power upon rotation of diode wheel rim 12 within the electromagnetic machine. Although only one rectifier assembly 10 is shown, it is to be appreciated that typically a plurality of rectifier assemblies 10 are mounted to and carried by diode wheel rim 12. For example, diode wheel rim 12 may carry six rectifier assemblies 10 which are spaced approximately 60o apart from each other relative to the axis of rotation of diode wheel rim 12. A diode wheel 11, including a diode wheel rim 12, is mounted to and carried by a rotor 9 of the electromagnetic machine.

Rectifier assembly 10 generally includes a block 14, layer of insulation 16, outer heat sinks 18, rectifier elements 20, inner heat sinks 22, spring washers 24, pivot pins 26, clamping bar 28, clamping bolt 30, jumpers 32, insulating tube 34, elastomeric spacer 36, AC bus bar 38 and DC bus bar 40.

Figure 2:
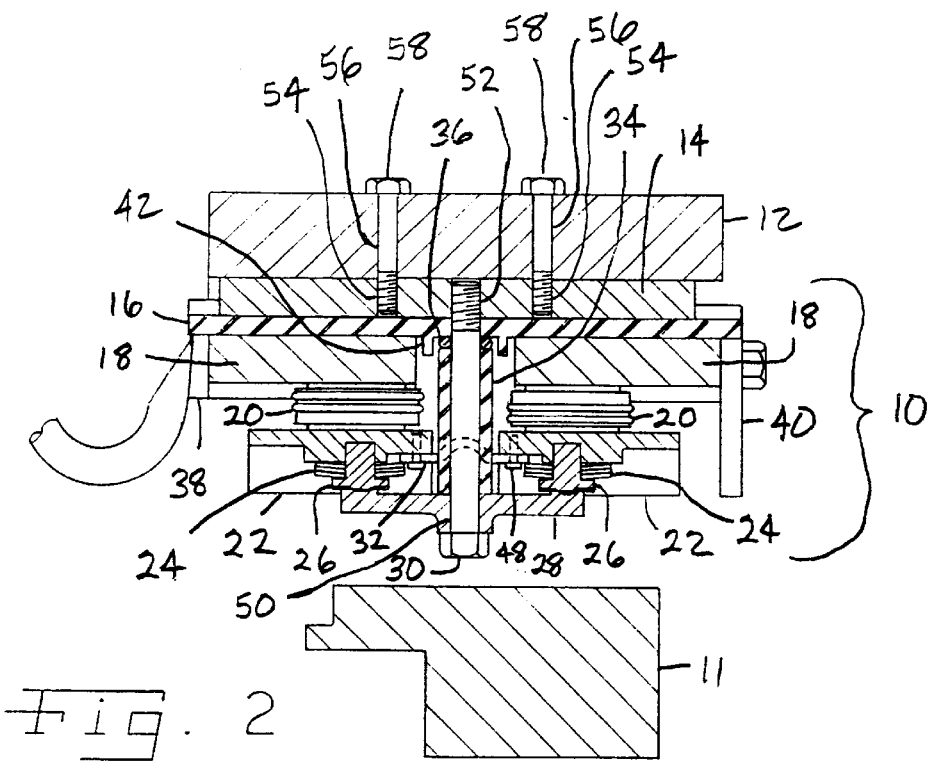
FIG. 2 is a cross-sectional view of the rectifier assembly of FIG. 1 when assembled and attached to the diode wheel rim.

The two outer heat sinks 18 are respectively connected to AC bus bar 38 and DC bus bar 40. Outer heat sinks 18 are each electrically connected with a respective rectifier element 20, such that AC power may flow to one rectifier element 20, and DC power may flow from the other rectifier element 20. Outer heat sinks 18 are spaced apart from each other and electrically insulated from each other so that an electrical short condition does not exist. More particularly, outer heat sinks 18 each lie against layer of insulation 16, which in turn includes two projections 42 (FIG. 2) which extend therefrom. Projections 42 are disposed between outer heat sinks 18 to thereby space apart outer heat sinks 18 at a corresponding distance. Outer heat sinks 18 are preferably in the form of fin-type heat sinks or heat exchangers including a plurality of fins 44. Upon rotation of diode wheel rim 12, fins 44 provide heat transfer from outer heat sinks 18 primarily in the form of convection cooling.

Layer of insulation 16 also includes a generally U-shaped cross-section (FIG. 3) which partially surrounds block 14. The U-shaped cross-section allows layer of insulation 16 to be easily and properly positioned relative to block 14.

Block 14 and layer of insulation 16 interconnect outer heat sinks 18 with diode wheel rim 12 in a manner such that an air space 46 is created between outer heat sinks 18 and diode wheel rim 12. Air space 46 on each side of block 14 provides increased convection cooling of outer heat sinks 18, which in turn provides improved cooling of rectifier assembly 10 upon rotation of diode wheel rim 12. Conventional rectifier assemblies, because of the typical method of assembly, are bolted directly against diode wheel rim 12, with only a thin layer of insulation being disposed therebetween. The layer of insulation in a conventional rectifier assembly covers substantially the entire surface area between the outer heat sinks and the diode wheel rim, thereby prohibiting cooling air from passing therebetween upon rotation of the diode wheel rim. The present invention therefore provides substantially improved cooling of rectifier assembly 10 upon rotation of diode wheel rim 12.

Inner heat sinks 22 are also in the form of fin-type heat sinks or heat exchangers which provide cooling of rectifier assembly 10. Inner heat sinks 22 are electrically connected together via jumpers 32. Jumpers 32 may be directly attached to inner heat sinks 22, such as through rivets 38 or the like, to ensure good electrical conductivity therebetween.

At least one rectifier element 20 is associated with each inner heat sink 22 and corresponding outer heat sink 18. In the embodiment shown, each rectifier element is in the form of a rectifier diode, with one rectifier diode being associated with each inner heat sink 22. Rectifier diodes 20 are used to convert AC power into DC power, in known manner. Other types of rectifier elements may also possibly be used.

Inner heat sinks 22 are biased towards the associated rectifier diodes 20 and outer heat sinks 18 using clamping bar 28, pivot pins 26 and spring washers 24. Pivot pins 26 include a small arcuate surface (not numbered) on a side thereof which is adjacent to clamping bar 28. The arcuate surface allows slight relative pivotal movement between pivot pins 26 and clamping bar 28. This pivotal movement in turn allows inner heat sinks 22 to be clamped flatly against the side of a rectifier diode 20 which lies immediately adjacent thereto. This flat clamping action ensures both good electrical as well as thermal conductivity between inner heat sinks 22 and the associated rectifier diodes 20. Spring washers 24, such as the three Bellville™ washers shown, provide a resilient clamping force against the associated inner heat sink 22 when clamping bar 28 is biased towards inner heat sinks 22. To that end, clamping bolt 30 extends through opening 50 in clamping bar 28 and is threadingly engaged with a female threaded opening 52 in block 14. Clamping bolt 30 may be torqued to a desired amount to provide a corresponding desired axial loading on diode rectifiers 20 disposed between inner heat sinks 22 and outer heat sinks 18. Electrically insulating tube 34 is disposed around clamping bolt 30 and is positioned between clamping bar 28 and block 14. Elastomeric spacer 36 is also disposed around clamping bolt 30, and is positioned at an end of tube 34. In the embodiment shown, elastomeric spacer 36 is in the form of an elastomeric O-ring which is positioned at an end of tube 34 which is closest to layer of insulation 16. O-ring 36 is thus interposed between tube 34 and layer of insulation 16. Because of the slightly compressible nature of O-ring 36, tube 34 and O-ring 36 are capable of accommodating axial tolerance stick-ups which occur because of variations in the parts making up rectifier assembly 10.

In the embodiment shown, outer heat sink 18 is in the form of a two-piece outer heat sink. Accordingly, clamping bolt 30 extends through outer heat sink 18 by extending between the two heat sink halves making up outer heat sink 18. Similarly, inner heat sink 22 in the embodiment shown is a two-piece inner heat sink having two separate heat sink halves between and through which clamping bolt 30 extends.

When assembled together, as described below, rectifier assembly 10 is fastened to diode wheel rim 12 using suitable fasteners. In the embodiment shown, block 14 of rectifier assembly 10 includes two threaded holes 54 which align with corresponding holes 56 in diode wheel rim 12. A pair of bolts 58 extend through each pair of corresponding holes 54 and 56 and are used to easily and securely fasten rectifier assembly 10 to diode wheel rim 12 at a desired location. It is also possible to fasten each rectifier assembly 10 to diode wheel rim 12 in a different suitable manner, such as with rivets, welding, etc.

Figure 3:
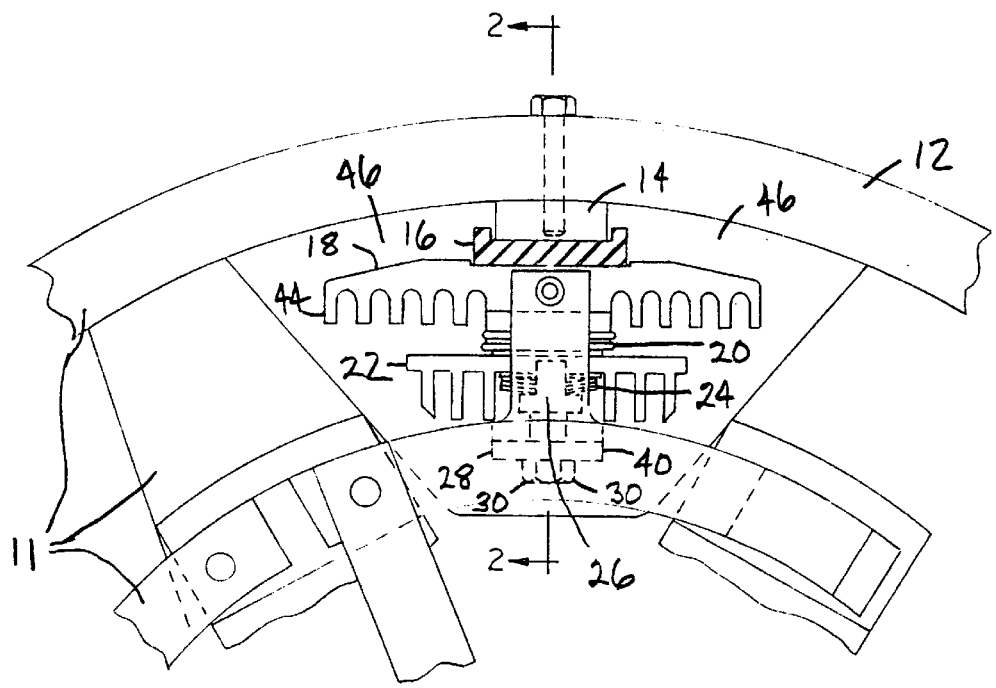
FIG. 3 is an end view of the rectifier assembly and diode wheel rim of FIGS. 1 and 2, viewed in a direction generally parallel to an axis of rotation of the diode wheel rim.

To assemble rectifier assembly 10, layer of insulation 16 is placed against block 14 such that the U-shaped cross-section of layer of insulation 16 partially surrounds block 14 as shown in FIG. 3. The two halves of outer heat sink 18 are placed on either side of layer of insulation 16, such that projections 42 are disposed therebetween. The two rectifier diodes 20 are then placed against each corresponding outer heat sink 18. Jumpers 32 are connected between inner heat sinks 22, and each inner heat sink 22 is then placed against a corresponding rectifier diode 20. Bellville washers 24 are placed against inner heat sinks 22. The projection portion of pivot pins 26 extends through the center of a stack of three Bellville washers 24 associated with each inner heat sink 22, and into a pin receiving opening (not numbered) in each inner heat sink 22. Clamping bolt 30 is extended through opening 50 in clamping bar 28, and insulating tube 34 and O-ring 36 are then slid over clamping bolt 30. Clamping bolt 30, with insulating tube 34 and O-ring 36 therearound, is projected through the space defined by the two pieces making up each of inner heat sink 22 and outer heat sink 18. Clamping bolt 30 is then threadingly mated with female threaded opening 52 in block 14 and torqued to a desired amount. The torque level on clamping bolt 30 provides a proper axial loading of rectifier diodes 20. Small angular misalignments between inner heat sink 22, rectifier diodes 20 and outer heat sink 18 is accommodated through the pivotal action between pivot pins 26 and clamping bar 28.

INDUSTRIAL APPLICABILITY

In use, electrical current flows through AC bus bar 38 to the associated half of outer heat sink 18, rectifier diode 20 and inner heat sink 22. Electrical current then crosses over from one half of inner heat sink 22 to the other half of inner heat sink 22, flows through the other rectifier diode 20, the other half of outer heat sink 18 and out through DC buss bar 40. Rectifier diodes 20 convert the AC power which is supplied at AC bus bar 38 to DC power which is present at DC bus bar 40.

Other aspects, objects and advantages of this invention can be obtained from a study of the drawings, the disclosure and the appended claims.

What is claimed is:

1. A rotating electromagnetic machine, comprising:
   a rotor;
   a diode wheel rim attached to and carried by aid rotor; and
   a rectifier assembly connected to said diode heel rim for generating direct current, said rectifier assembly including:
      an outer heat sink connected with said diode wheel rim, said outer heat sink having an outer surface facing toward said diode wheel rim and an inner surface generally opposite said outer surface, said diode wheel rim and a majority of said outer surface defining an air space therebetween for cooling during rotation of said diode wheel rim; and
      at least one rectifier element electrically connected with said inner surface of said outer heat sink.

2. The rotating electromagnetic machine of claim 1, further comprising a block attached to said diode wheel rim and interconnecting said diode wheel rim with said outer heat sink, said block having a surface facing toward said outer surface of said outer heat sink with an area which is smaller than an area of said outer surface.

3. The rotating electromagnetic machine of claim 1, wherein said outer heat sink comprises a two-piece heat sink.

4. The rotating electromagnetic machine of claim 1, further comprising an inner heat sink disposed on a side of said at least one rectifier element opposite said outer heat sink, said inner heat sink being electrically connected with each said rectifier element.

5. The rotating electromagnetic machine of claim 4, wherein said inner heat sink comprises a two-piece heat sink.

6. The rotating electromagnetic machine of claim 4, further comprising a block attached to said diode wheel rim, and a clamping bolt extending through each of said inner heat sink and said outer heat sink and threadingly engaged with said block.

7. The rotating electromagnetic machine of claim 6, further comprising a clamping bar positioned on a side of said inner heat sink opposite said at least one rectifier element, said clamping bar having an opening therein, said clamping bolt extending through said opening.

8. The rotating electromagnetic machine of claim 6, further comprising an electrically insulating tube disposed around said clamping bolt.

9. The rotating electromagnetic machine of claim 8, further comprising an elastomeric spacer positioned around said clamping bolt on an end of said tube, said spacer configured to accommodate axial stack-up tolerances of said rectifier assembly in an axial direction of said clamping bolt.

10. The rotating electromagnetic machine of claim 9, wherein said elastomeric spacer comprises an elastomeric O-ring.

11. The rotating electromagnetic machine of claim 9, wherein said elastomeric spacer is positioned on an end of said tube toward said outer heat sink.

12. The rotating electromagnetic machine of claim 9, further comprising a layer of insulation disposed between said block and said outer heat sink.

13. The rotating electromagnetic machine of claim 1, wherein said at least one rectifier element comprises at least one rectifier diode.

14. The rotating electromagnetic machine of claim 13, wherein said at least one rectifier diode comprises two rectifier diodes.

15. The rotating electromagnetic machine of claim 1, wherein said inner surface comprises a central portion and two outer portions extending therefrom, the central portion connected with said rectifier element and the outer portions defining a plurality of generally radially-oriented fins.

16. A rectifier assembly for use in a rotating electromagnetic machine, said rectifier assembly comprising:
   an outer heat sink;
   an inner heat sink;
   at least one rectifier element disposed between and electrically connected with each of said outer heat sink and said inner heat sink;
   a block disposed adjacent to said outer heat sink generally opposite said at least one rectifier element;
   a clamping bolt extending through each of said inner heat sink and said outer heat sink and threadingly engaged with said block;
   an electrically insulating tube disposed around said clamping bolt; and
   an elastomeric spacer positioned around said clamping bolt on an end of said tube, said spacer configured to accommodate axial stack-up tolerances of said rectifier assembly in an axial direction of said clamping bolt.

17. The rectifier assembly of claim 16, wherein said elastomeric spacer comprises an elastomeric O-ring.

18. The rectifier assembly of claim 17, wherein said elastomeric spacer is positioned on an end of said tube toward said outer heat sink.

19. The rectifier assembly of claim 16, further comprising a layer of insulation disposed between said block and said outer heat sink.

20. The rectifier assembly of claim 16, wherein said outer heat sink comprises a two-piece heat sink.

21. The rectifier assembly of claim 16, wherein said inner heat sink comprises a two-piece heat sink.

22. The rectifier assembly of claim 16, wherein said at least one rectifier element comprises at least one rectifier diode.

23. The rectifier assembly of claim 22, wherein said at least one rectifier diode comprises two rectifier diodes.

24. A method of assembling a rectifier assembly for use in a rotating electromagnetic machine, comprising the steps of:

positioning an outer heat sink against a block;

placing at least one rectifier element against said outer heat sink;

locating an inner heat sink on a side of said at least one rectifier element opposite said outer heat sink;

extending a clamping bolt through a clamping bar, an electrically insulating tube, and an elastomeric spacer at an end of said tube;

projecting said clamping bolt, with said tube and said spacer therearound, through said inner heat sink and said outer heat sink;

threadingly coupling said clamping bolt with said block, whereby said inner heat sink, said at least one rectifier element and said outer heat sink are clamped between said clamping bar and said block.

25. The method of claim 24, comprising the further step of attaching said block to a diode wheel rim.

26. The method of claim 25, wherein said attaching step comprises bolting said block together with said diode wheel rim.

27. The method of claim 24, comprising the further step of placing at least one spring washer between each said inner heat sink and said clamping bar.

28. The method of claim 24, comprising the further step of placing at least one layer of insulation between said block and said outer heat sink.

* * * * *